United States Patent
Moon et al.

(10) Patent No.: US 8,791,459 B2
(45) Date of Patent: Jul. 29, 2014

(54) ARRAY SUBSTRATE, MANUFACTURING METHOD OF THE SAME, AND FABRICATING METHOD OF DISPLAY DEVICE INCLUDING THE ARRAY SUBSTRATE

(71) Applicant: LG Display Co., Ltd., Seoul (KR)

(72) Inventors: Tae-Hyoung Moon, Goyang-si (KR); Kyu-Hwang Lee, Seoul (KR); Kyung-Ha Lee, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/717,006

(22) Filed: Dec. 17, 2012

(65) Prior Publication Data
US 2014/0021475 A1 Jan. 23, 2014

(30) Foreign Application Priority Data
Jul. 18, 2012 (KR) .......................... 10-2012-0078151

(51) Int. Cl.
| | |
|---|---|
| *H01L 29/04* | (2006.01) |
| *H01L 31/036* | (2006.01) |
| *H01L 31/0376* | (2006.01) |
| *H01L 31/20* | (2006.01) |
| *H01L 29/12* | (2006.01) |
| *H01L 21/00* | (2006.01) |
| *H01L 21/84* | (2006.01) |
| *H01L 29/786* | (2006.01) |
| *H01L 29/66* | (2006.01) |

(52) U.S. Cl.
CPC ........ *H01L 29/786* (2013.01); *H01L 29/66742* (2013.01)
USPC 257/59; 257/43; 257/E21.704; 257/E29.296; 438/34; 438/151

(58) Field of Classification Search
CPC ........................ H01L 29/786; H01L 29/66742
USPC ......... 257/43, 59, E21.704, E29.296; 438/34, 438/151
See application file for complete search history.

(56) References Cited

U.S. PATENT DOCUMENTS

| | | | |
|---|---|---|---|
| 2011/0212557 A1* | 9/2011 | Cho et al. | 438/34 |
| 2011/0297930 A1* | 12/2011 | Choi et al. | 257/43 |
| 2013/0140570 A1* | 6/2013 | Kang et al. | 257/59 |

* cited by examiner

*Primary Examiner* — David S Blum
(74) *Attorney, Agent, or Firm* — Fenwick & West LLP

(57) ABSTRACT

An array substrate for a display device includes an insulation substrate, a gate line formed on the insulation substrate, a data line crossing the gate line to define a pixel area, a thin film transistor including a gate electrode connected to the gate line, a source electrode connected to the data line, and a drain electrode, a passivation layer covering the gate line, the data line and the thin film transistor and including a drain contact hole to expose the drain electrode, and a pixel electrode formed on the pixel area and being connected to the drain contact hole through the drain contact hole. Each of the data line, the source electrode and the drain electrode includes a lower layer having copper and an upper layer covering upper and side surfaces of the lower layer, and the upper layer is thinner than the lower layer.

20 Claims, 6 Drawing Sheets

US 8,791,459 B2

ARRAY SUBSTRATE, MANUFACTURING METHOD OF THE SAME, AND FABRICATING METHOD OF DISPLAY DEVICE INCLUDING THE ARRAY SUBSTRATE

CROSS-REFERENCE TO RELATED APPLICATIONS

The present invention claims the benefit of Korean Patent Application No. 10-2012-0078151 filed on Jul. 18, 2012, which is hereby incorporated by reference for all purposes as if fully set forth herein.

BACKGROUND OF THE INVENTION

1. Field of the Invention

The present invention relates to a display device. More particularly, the present invention relates to an array substrate, a manufacturing method of the same and a fabricating method of a display device including the array substrate.

2. Discussion of the Related Art

According to the development of the information, society's needs for various display devices which display images are increasing. In recent years, flat panel display devices such as an liquid crystal display (LCD) device, a plasma display panel (PDP), and an organic light emitting diode (OLED) are adopted. Among these flat panel display devices, the LCD device is widely used since it is compact-sized, light weight, thin, and can be driven with low power.

The pixel areas of this display are defined by crossing gate lines and data lines each other and disposed in matrix structure. In each of the pixel areas, a switching device such as a thin film transistor (TFT) and a pixel electrode connected to the TFT are disposed, and widely adopted is an active matrix type where a data signal applied to the pixel area is controlled by the switching device.

An active matrix display device includes an array substrate having a gate line, a data line, a switching device, and a pixel electrode, which is explained with reference to the attached drawings.

FIG. 1 is a cross-sectional view of an array substrate of an active matrix display device according to the related art.

As shown in FIG. 1, a gate line 22, a gate electrode 24, and a gate pad 26 are formed on a substrate 10. The gate electrode 24 is connected to the gate line 22 and a gate pad 26 is positioned at one end of the gate line 22.

A gate insulation layer 30 is formed on the gate line 22, the gate electrode 24, and a gate pad 26.

An active layer 42 of intrinsic silicon is formed on the gate insulation layer 30 over the gate electrode 24, and an ohmic contact layer 44 made of impurity-doped silicon is formed on the active layer 42.

On the ohmic contact layer 44, a data line 52, a source electrode 54, a drain electrode 56 and a data pad 58 are formed. The source electrode 54 is connected to the data line 52, the drain electrode 56 is spaced apart from the source electrode 54, and the data pad 58 is positioned at one end of the data line 52.

On the data line 52, the source electrode 54, the drain electrode 56, and the data pad 58, a passivation layer 60 is formed. The passivation layer 60 includes a drain contact hole 60a exposing the drain electrode 56, a gate pad contact hole 60b exposing the gate pad 26, and a data pad contact hole 60c exposing the data pad 58. Here, the gate pad contact hole 60b is formed by penetrating the gate insulation layer 30.

On the passivation layer 60, a pixel electrode 72, a gate pad terminal 74, and a data pad terminal 76 are formed. The pixel electrode 72 is connected to the drain electrode 56 through the drain contact hole 60a, the gate pad terminal 74 is connected to the gate pad 26 through the gate pad contact hole 60b, and the data pad terminal 76 is connected to the data pad 58 through the data pad contact hole 60c.

Recently, since display devices become larger and are required to have a high resolution characteristic, the gate line 22 and the data line 52 become longer. This causes increase of the resistivity of the lines, resulting in delay of signals. Further, since the driving speed becomes higher, load on the lines increases.

To solve these problems, materials of relatively low specific resistance such as copper are adopted for gate and data lines 22 and 52.

Since copper is easily affected by the etching solution, the gate lines 22 and the data lines 52 can be damaged during forming of the contact holes 60a, 60b and 60c. That is to say, the drain contact hole 60a and the data pad contact hole 60c are formed by etching only the passivation layer 60, but the gate pad contact hole 60b is formed by etching both of the passivation layer 60 and the gate insulation layer 30. This means that while forming the gate pad contact hole 60b, the drain electrode 56 and the data pad 58 are exposed earlier and are damaged by the etching solution. This causes increase of contact resistance between the pixel electrode 72 and the drain electrode 56, and between the data pad terminal 76 and the data pad 58.

SUMMARY OF THE INVENTION

Accordingly, the present invention is directed to an array substrate, a manufacturing method of the same and a fabricating method of a liquid crystal display device including the array substrate that substantially obviates one or more problems due to limitations and disadvantages of the related art.

An advantage of the present invention is to provide an array substrate and a manufacturing method of the same that improve contact resistance between the electrodes.

Another advantage of the present invention is to provide an array substrate and a manufacturing method of the same that improve reliability of the thin film transistor.

Additional features and advantages of the invention will be set forth in the description which follows, and in part will be apparent from the description, or may be learned by practice of the invention. The advantages of the invention will be realized and attained by the structure particularly pointed out in the written description and claims hereof as well as the appended drawings.

To achieve these and other advantages and in accordance with the purpose of the present invention, as embodied and broadly described, an array substrate for a display device comprising a substrate; a gate pad, a gate electrode, and a gate line formed on the substrate; a gate insulation layer formed over the gate pad, the gate electrode, and the gate line; a semiconductor layer formed on the gate insulation layer; a drain electrode and a source electrode formed on the semiconductor layer, a thin film transistor including the gate electrode, the drain electrode, and the source electrode; a data line formed on the gate insulation layer and crossing the gate line to define a pixel area, the data line coupled to the source electrode; a passivation layer formed over the data line, the source electrode, the drain electrode, and a portion of the gate insulation layer, the passivation layer including a drain contact hole to expose the drain electrode; and a pixel electrode formed on the passivation layer in the pixel area and connected to the drain electrode through the drain contact hole, and wherein each of the data line, the source electrode, and the drain electrode includes a lower layer having copper and an upper layer covering upper and side surfaces of the lower layer, and wherein the upper layer is thinner than the lower layer.

In another aspect of the present invention, an array substrate for a display device comprises a substrate; a gate pad, a gate electrode, and a gate line formed on the substrate; a gate insulation layer formed over the gate pad, the gate electrode, and the gate line; a semiconductor layer formed on the gate insulation layer; a drain electrode and a source electrode formed on the semiconductor layer, a thin film transistor including the gate electrode, the drain electrode, and the source electrode, the source electrode including a first source electrode layer made of a first material and a second source electrode layer made of a second material that covers the first source electrode layer, and the drain electrode including a first drain electrode layer made of the first material and a second drain electrode layer made of the second material that covers the first drain electrode layer; a data line formed on the gate insulation layer and crossing the gate line to define a pixel area, the data line coupled to the source electrode and including a first data line layer made of the first material and a second data line layer made of the second material that covers the first data line layer; a passivation layer formed over the data line, the source electrode, the drain electrode, and a portion of the gate insulation layer, the passivation layer including a drain contact hole to expose the drain electrode; and a pixel electrode formed on the passivation layer in the pixel area and connected to the drain electrode through the drain contact hole, and wherein the second material is more resistive to an etching solution used to form the drain contact hole than the first material.

In another aspect of the present invention, a method of fabricating an array substrate for a display device includes forming a gate pad, a gate electrode, and a gate line on a substrate; forming a gate insulation layer over the gate pad, the gate electrode, and the gate line; forming a semiconductor layer on the gate insulation layer; forming a drain electrode and a source electrode on the semiconductor layer, a thin film transistor including the gate electrode, the drain electrode, and the source electrode; forming a data line on the gate insulation layer, the data line crossing the gate line to define a pixel area and the data line coupled to the source electrode; forming a passivation layer over the data line, the source electrode, the drain electrode, and a portion of the gate insulation layer, the passivation layer including a drain contact hole to expose the drain electrode; and forming a pixel electrode on the passivation layer in the pixel area, the pixel electrode connected to the drain electrode through the drain contact hole, and wherein each of the data line, the source electrode, and the drain electrode is formed to include a lower layer having copper and an upper layer covering upper and side surfaces of the lower layer, and wherein the upper layer is formed thinner than the lower layer.

In another aspect of the present invention, a method of fabricating an array substrate for a display device includes forming a gate pad, a gate electrode, and a gate line formed on a substrate; forming a gate insulation layer over the gate pad, the gate electrode, and the gate line; forming a semiconductor layer on the gate insulation layer; forming a drain electrode and a source electrode on the semiconductor layer, a thin film transistor including the gate electrode, the drain electrode, and the source electrode, the source electrode formed to include a first source electrode layer made of a first material and a second source electrode layer made of a second material that covers the first source electrode layer, and the drain electrode formed to include a first drain electrode layer made of the first material and a second drain electrode layer made of the second material that covers the first drain electrode layer; forming a data line on the gate insulation layer, the data line crossing the gate line to define a pixel area, the data line coupled to the source electrode and formed to include a first data line layer made of the first material and a second data line layer made of the second material that covers the first data line layer; forming a passivation layer over the data line, the source electrode, the drain electrode, and a portion of the gate insulation layer, the passivation layer formed to include a drain contact hole to expose the drain electrode; and forming a pixel electrode on the passivation layer in the pixel area, the pixel electrode being connected to the drain electrode through the drain contact hole, and wherein the second material is more resistive to an etching solution used to form the drain contact hole than the first material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Figure 1:
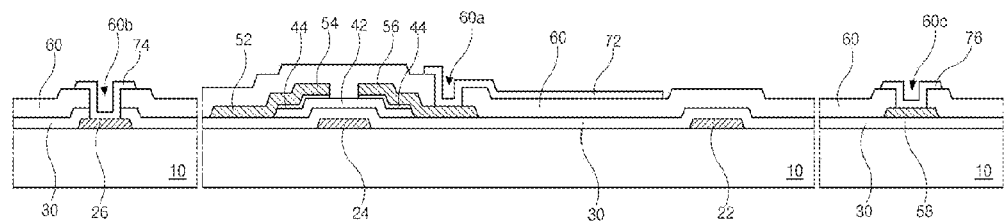
FIG. 1 is a cross-sectional view of an array substrate of a display device according to the related art.
Figure 2:
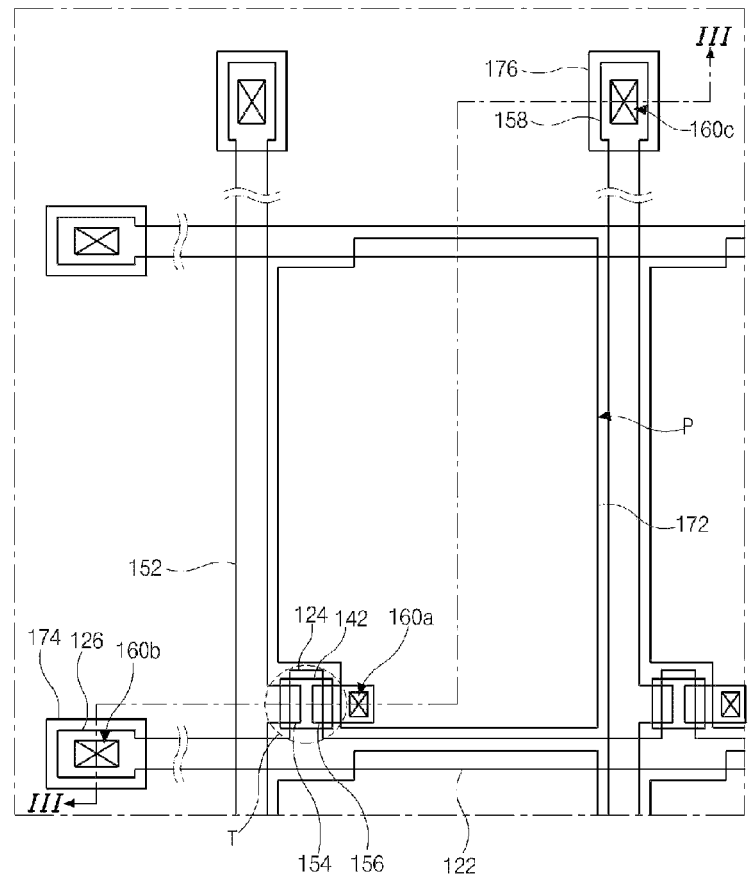
FIG. 2 is a plan view of an array substrate for a display device according to a first embodiment of the present invention.
Figure 3:
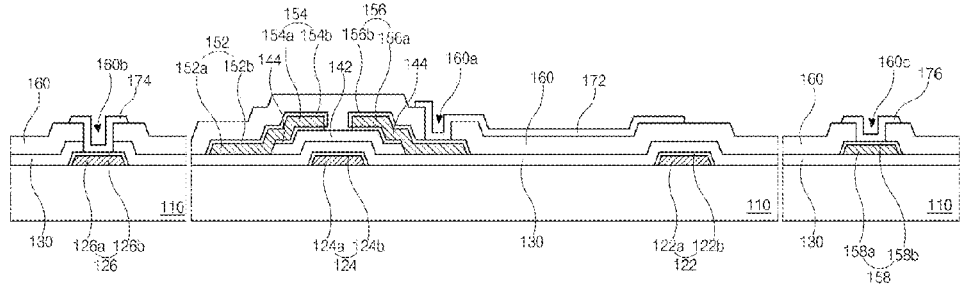
FIG. 3 is a cross-sectional view which is taken along a line III-III of FIG. 2.

FIG. 2 is a plan view of an array substrate for a display device according to a first embodiment of the present invention and FIG. 3 is a cross-sectional view which is taken along a line III-III of FIG. 2.

As shown, a gate line 122 made of conductive material is formed in a first direction on a transparent insulation substrate 110. Simultaneously a gate electrode 124 elongated from the gate line 122 and a gate pad 126 positioned at one end of the gate line 122 are formed. The gate line 122, the gate electrode 124, and the gate pad 126 respectively include lower layers 122a, 124a and 126a and upper layers 122b, 124b, and 126b. The upper layers 122b, 124b and 126b are thinner than the lower layers 122a, 124a and 126a, and cover the lower layers 122a, 124a and 126a by contacting upper and side surfaces of the lower layers 122a, 124a and 126a. The lower layers 122a, 124a and 126a are made of a first material such as copper and the upper layers 122b, 124b and 126b are made of a second material such as nickel in one embodiment. The upper layers 122b, 124b and 126b are formed by a plating method.

On the gate line 122, the gate electrode 124, and the gate pad 126, a gate insulation layer 130 made of silicon nitride ($SiN_x$) or silicon oxide ($SiO_2$) is formed.

An active layer 142 of intrinsic amorphous silicon is formed on the gate insulating layer 130 over the gate electrode 124, and an ohmic contact layer 144 of doped amorphous silicon is formed on the active layer 142.

A data line 152, a source electrode 154, a drain electrode 156, and a data pad 158 which are made of conductive material are formed on the ohmic contact layer 144. The data line 152 is formed in the second direction to define a pixel area P by crossing the gate line 122. The source electrode 154 is elongated from the data line 152 and the drain electrode 156 and the source electrode 154 are separated from each other having the gate electrode 124 in between. The data pad 158 is positioned at one end of the data line 152.

The data line 152, source electrode 154, and drain electrode 156, and the data pad 158 respectively include lower layers 152a, 154a, 156a and 158a and upper layers 152b, 154b, 156b and 158b. The upper layers 152b, 154b, 156b and 158b are thinner than the lower layers 152a, 154a, 156a and 158a and cover the lower layers 152a, 154a,156a, and 158a by contacting upper and side surfaces of the lower layers 152a, 154a, 156a, and 158a. The lower layers 152a, 154a, 156a, and 158a are made of copper and the upper layers 152b, 154b, 156b, and 158b are made of nickel. The upper layers 152b, 154b, 156b, and 158b are formed by plating method.

Source and drain electrodes 154 and 156 form a thin film transistor T with the active layer 142 and the gate electrode 124, and the exposed active layer 142 functions as a channel of the thin film transistor T.

On the data line 152 and source and drain electrodes 154 and 156, and a data pad 158, a passivation layer 160 made of silicon nitride, silicon oxide, or organic insulation material is formed. The passivation layer 160 contains a contact hole 160a exposing the drain electrode 156, a gate pad contact hole 160b exposing the gate pad 126, and a data pad contact hole 160c exposing the data pad 158. Here, the gate pad contact hole 160b is formed by penetrating the gate insulation layer 130.

On the passivation layer 160, a pixel electrode 172, a gate pad terminal 174 and a data pad terminal 176 are formed using transparent conductive material. The pixel electrode 172 is positioned on the pixel area P and connected to the drain electrode 156 through the drain contact hole 160a. The gate pad terminal 174 is connected to a gate pad 126 through the gate pad contact hole 160b and the data pad terminal 176 is connected to the data pad 158 through the data pad contact hole 160c. Substantially, the pixel electrode 172 contacts the upper layer 156b of the drain electrode 156 and the gate pad terminal 174 contacts the upper layer 126b of the gate pad 126, and the data pad terminal 176 contacts the upper layer 158b of the data pad 158.

The pixel electrode 172 overlaps the gate line 122 to form a storage capacitor. Although not shown, a storage capacitor can be formed by forming a metal pattern on the gate insulation layer 130 over the gate line 122 with the same material as the data line 152 and contacting the pattern to the pixel electrode 172.

According to this embodiment of the invention, it is possible to prevent the drain electrode 156 and the data pad 158 from being damaged by the etching solution during forming of contact holes 160a, 160b, and 160c by using the upper layers 156b and 158b made of the second material (e.g., nickel) that is more resistive to the etching solution than the first material (e.g., copper) that is used to make the lower layers 156a and 158a. When the etching solution is applied to form the contact hole 160b, the etching solution is applied for a length of time that allows for the contact hole 160b to form through the gate insulation layer 130 and the passivation layer 160. During the time in which the etching solution is applied to form the contact hole 160b, damage to the drain electrode 156 and the data pad 158 from the etching solution is prevented by the upper layers 156b and 158b. Therefore, delay of the signals is prevented and the load is decreased. Further, it is possible to improve the contact characteristics between the data pad terminal 176 and the data pad 158 and between the pixel electrode 172 and the drain electrode 156.

A manufacturing method of this array substrate is explained with reference to FIGS. 4A to 4F and FIG. 3. FIGS. 4A to 4F are cross-sectional views showing a manufacturing process of the array substrate according to the embodiment of the present invention.

Figure 4A:
FIGS. 4A to 4F are cross-sectional views showing a manufacturing process of the array substrate according to a first embodiment of the present invention.

As shown in FIG. 4A, conducting material such as a metallic material is deposited onto a transparent insulation substrate 110 such as a glass or a plastic by a depositing method, such as sputtering. Using a photo-lithography method, the lower layers 122a, 124a and 126a of the gate line 122, the gate electrode 124 and the gate pad 126 are formed.

The lower layers 122a, 124a, and 126a of the gate line 122, the gate electrode 124 and the gate pad 126 are made of copper which has relatively low specific resistance to lower resistance of lines and to prevent delay of signals. The lower layers 122a, 124a, and 126a of the gate line 122, the gate electrode 124, and the gate pad 126 may be a single layer of copper. Alternatively, in order to increase interface characteristics they may have a double layered structure that a buffer layer made of molybdenum, titanium, tantalum, or alloys of these is positioned beneath the copper layer.

Figure 4B:

Next, as shown in FIG. 4B, by a plating process the upper layers 122b, 124b, and 126b of the gate line 122, the gate electrode 124, and the gate pad 126 are formed to cover upper and side surfaces of the lower layers 122a, 124a and 126a of the gate line 122, the gate electrode 124 and the gate pad 126, thereby forming the gate line 122, the gate electrode 124 and the gate pad 126. The upper layers 122b, 124b, and 126b can be made of nickel and an electroless-plating method can be adopted for the plating process.

Although not shown, the gate line 122 is formed in the first direction, the gate electrode 124 is elongated from the gate line 122, and the gate pad 126 is positioned at one end of the gate line 122.

Here, the upper layers 122b, 124b and 126b are preferably thinner than the lower layers 122a, 124a and 126a of the gate line 122, the gate electrode 124, and the gate pad 126. If the upper layers 122b, 124b and 126b are too thick, the heights of the gate line 122, gate electrode 124 and the gate pad 126 become too large, which may cause shortage of the layers formed in the later on the upper layers 122b, 124b and 126b and may adversely affect the uniformity of cell gap of the device. Therefore, the thickness of the lower layers 122a, 124a and 126a may be in a range of 2000 Å to 3 μm, and the thickness of the upper layers 122b, 124b and 126b may be in a range of 300 Å to 900 Å according to one embodiment.

Figure 4C:
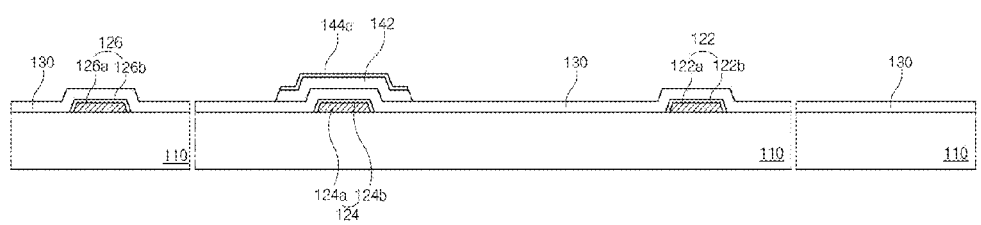

As shown in FIG. 4C, the gate insulation layer 130, an intrinsic silicon layer (not shown) and an impurity-doped silicon layer (not shown) are sequentially formed on the gate line 122, the gate electrode 124 and the gate pad 126 to form the active layer 142 and the ohmic contact pattern 144*a* by a photo-lithography method that uses a mask and patterns the doped silicon layer and the intrinsic silicon layer. Here, the gate insulation layer 130 and the intrinsic silicon layer (not shown) and the impurity-doped silicon layer (not shown) may be formed by a chemical vapor deposition method. The gate insulation layer 130 can be made of silicon nitride ($SiN_x$) or silicon oxide ($SiO_2$), the intrinsic silicon layer can be made of intrinsic amorphous silicon, and the impurity-doped layer can be made of intrinsic amorphous silicon doped with boron or phosphorus.

Figure 4D:
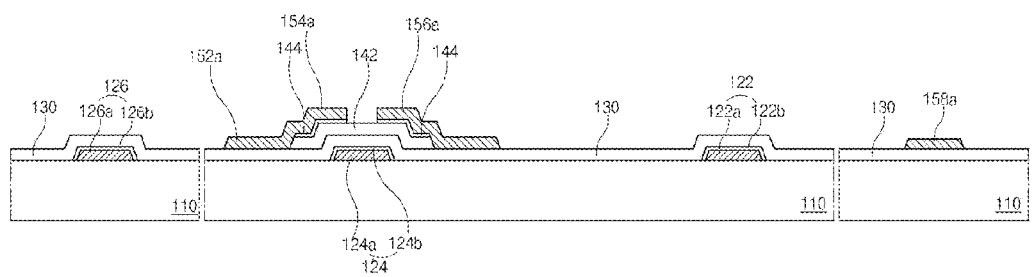

Next, as shown in FIG. 4D, conducting material such as a metallic material is deposited by a depositing method, such as sputtering, and by using a photo-lithography method, the lower layers 152*a*, 154*a*, 156*a* and 158*a* of the data line 152, the source electrode 154, the drain electrode 156 and the data pad 158 are formed. In succession, the ohmic contact layer 144 is formed by removing the ohmic contact pattern (144*a* of FIG. 4*c*) exposed between the lower layers 154*a* and 156*a* of the source electrode 154 and drain electrode 156.

The lower layers 152*a*, 154*a*, 156*a* and 158*a* of the data line 152, the source electrode 154, the drain electrode 156 and the data pad 158 are made of a first material such as copper which has relatively low specific resistance to lower resistance of lines and to prevent delay of signals. The lower layers 152*a*, 154*a*, 156*a* and 158*a* of the data line 152, the source electrode 154, the drain electrode 156 and the data pad 158 may be a single layer of copper. Also, to increase interface characteristics they may have a double layered structure that a buffer layer made of molybdenum, titanium, tantalum, or alloys of these is positioned beneath the copper layer.

Figure 4E:
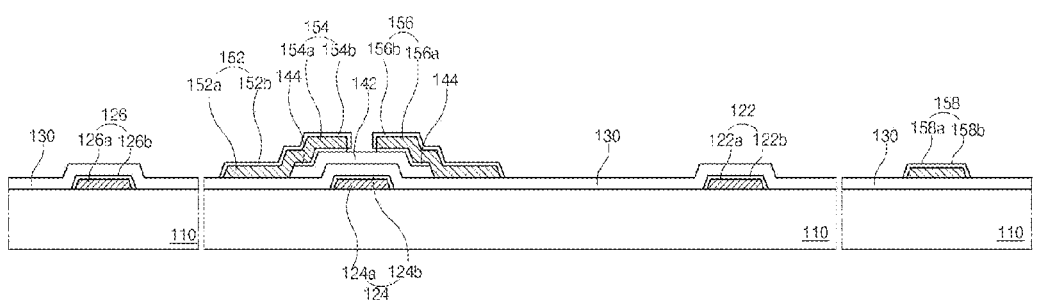

Next, as shown in FIG. 4E, by a plating process the upper layers 152*b*, 154*b*, 156*b* and 158*b* of the data line 152, the source electrode 154, the drain electrode 156 and the data pad 158 are formed to cover upper and side surfaces of the lower layers 152*a*, 154*a*, 156*a* and 158*a* of the data line 152, the source electrode 154, the drain electrode 156 and the data pad 158, thereby forming the data line 152, the source electrode 154, the drain electrode 156 and the data pad 158. The upper layers 152*b*, 154*b*, 156*b* and 158*b* can be made of a second material such as nickel and an electroless-plating method can be adopted for the plating process.

Although not shown, the data line 152 is formed in the second direction to define a pixel area P by crossing the gate line 122 and the data pad 158 is positioned at one end of the data line 152. The source electrode 154 is elongated from the data line 152 and the drain electrode 156 and the source electrode 154 are separated from each other having the gate electrode 124 in between.

Here, the upper layers 152*b*, 154*b*, 156*b* and 158*b* are preferably thinner than the lower layers 152*a*, 154*a*, 156*b* and 158*b* of the data line 152, the source electrode 154, the drain electrode 156 and the data pad 158. If the upper layers 152*b*, 154*b*, 156*b* and 158*b* are too thick, the heights of the data line 152, the source electrode 154, the drain electrode 156 and the data pad 158 become big, which may cause shortage of the layers formed in the later on the upper layers 152*b*, 154*b*, 156*b* and 158*b* and may adversely affect the uniformity of cell gap of the device. Therefore, the thickness of the lower layers 152*a*, 154*a*, 156*a* and 158*a* may be in a range of 2000 Å to 3 μm, and the thickness of the upper layers 152*b*, 154*b*, 156*b* and 158*b* may be in a range of 300 Å to 900 Å according to one embodiment.

Figure 4F:
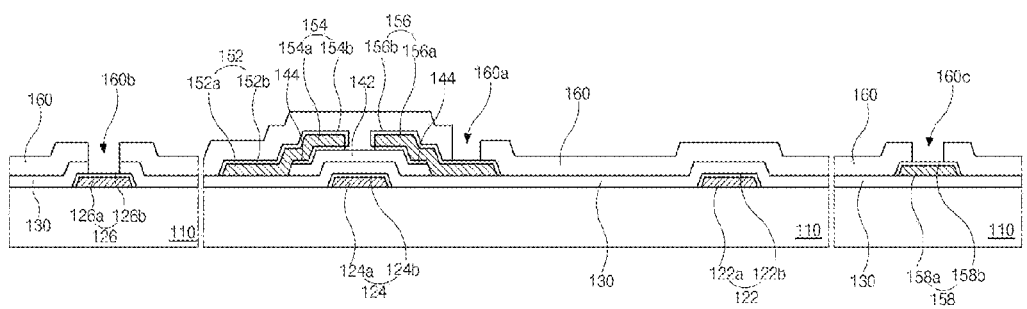

Next, as shown in FIG. 4F, the passivation layer 160 is formed by depositing an inorganic layer such as a silicon nitride layer or a silicon oxide layer. The passivation layer 160 is patterned by a photolithography method using a mask to form the drain contact hole 160*a*, the gate pad contact hole 160*b*, and the data pad contact hole 160*c*. Here, a portion of the gate insulation layer 130 corresponding to the gate pad contact hole 160*b* is removed further. The drain contact hole 160*a* exposes the drain electrode 156, and the gate pad contact hole 160*b* exposes the gate pad 126, and the data pad contact hole 160*c* exposes the data pad 158.

That is to say, before finishing formation of the gate pad contact hole 160*b* to expose the gate pad 126, the drain electrode 156 and the data pad 158 are exposed to the etching solution for removing the gate insulation layer 130. But, since the drain electrode 156 and the data pad 158 include upper layers 156*b* and 158*b* made of the second material such as nickel, which is not affected by the etching solution due to the higher resistivity to the etching solution compared to the first material such as copper, there is no damage to the drain electrode 156 and the data pad 158 by the etching solution.

Meanwhile, the passivation layer 160 can be an organic layer made of acryl, and in this case the surface of the passivation layer 160 becomes flat.

Next, as shown in FIG. 3, transparent conductive material is deposited and patterned by a photolithography method using a mask to form the pixel electrode 172, a gate pad terminal 174, and the data pad terminal 176. The pixel electrode 172 is positioned on the passivation layer 160 over the pixel area P, and connected to the drain electrode 156 through the drain contact hole 160*a*. Further, the pixel electrode 172 overlaps the gate line 122 to form a storage capacitor. The gate pad terminal 174 is connected to the gate pad 126 through the gate pad contact hole 160*b*, and the data pad terminal 176 is connected to the data pad 158 through data pad contact hole 160*c*. The transparent conductive material can be indium zinc oxide (IZO) and indium tin oxide (ITO).

As explained above, according to the invention, the gate line 122, the gate electrode 124, and the gate pad 126 includes the lower layers 122*a*, 124*a* and 126*a* made of copper and the upper layers 122*b*, 124*b* and 126*b* made of nickel, respectively, and the data line, the source electrode 154, the drain electrode 156 and the data pad 158 also include the lower layers 152*a*, 154*a*, 156*a* and 158*a* made of copper and the upper layer 152*b*, 154*b*, 156*b* and 158*b*. Therefore, the drain electrode 156 and the data pad 158 are not damaged by the etching solution while forming the contact hole and it is possible to improve contact characteristics.

Meanwhile, the upper layers 122*b*, 124*b* and 126*b* of the gate line 122, the gate electrode 124 and the gate pad 126 can be omitted.

If the upper layer of nickel is formed on the copper layer by a photolithography method instead of a plating process, the etching solution is applied to nickel and copper, which causes an overhang structure owing to the difference of the etching speed of nickel and copper. That is to say, copper is etched faster than nickel due to the lower resistivity of copper to the etching solution compared to the resistivity of nickel to the etching solution. Thus, the lower layer will be narrower than the upper layer, resulting in shortage or split of the lines i.e. the gate line 122, the data line 152 and so on.

In the meantime, recently a thin film transistor having an oxide semiconductor layer of excellent mobility characteristics is suggested and it does not include an ohmic contact layer. This kind of thin film transistor has an etch stopper to prevent the exposure of the oxide semiconductor layer to the etching solution, and the silicon oxide layer is weak to Hydrogen. Since peroxide is used in patterning source and drain electrodes, hydrogen gas occurs, affecting the silicon oxide layer. Therefore, to eliminate the hydrogen gas, a heat treatment is necessary after forming source and drain electrodes.

But, in case of using copper for source and drain electrodes, copper is oxidized during the heat treatment process and it is taken off from the silicon oxide layer.

Accordingly, the second embodiment of the invention directs to the array substrate including the thin film transistor having oxide semiconductor layer, where oxidation of copper is prevented during the heat treatment process.

Hereinafter, the array substrate according to the second embodiment of the invention will be explained with reference to the attached drawings.

Figure 5:
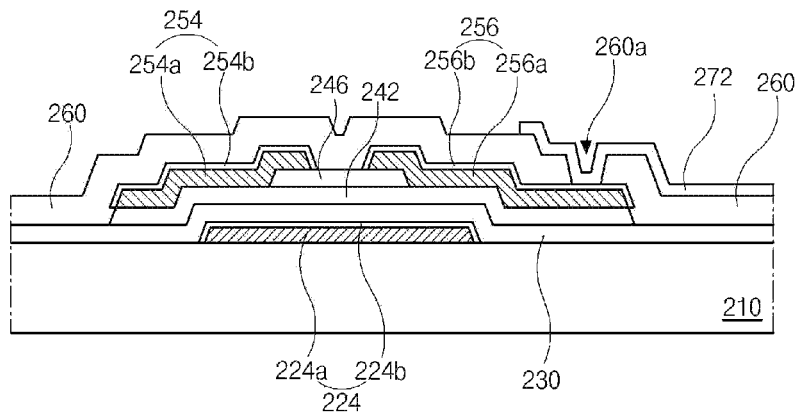
FIG. 5 is a cross-sectional view of an array substrate according to a second embodiment of the present invention.

FIG. 5 is a cross-sectional view of the array substrate according to the second embodiment of the invention, which includes a thin film transistor having an oxide semiconductor layer. The difference of the structure of the array substrate of FIG. 5 and the structure of the array substrate of FIG. 3 is only a thin film transistor, and thus the structure of the thin film transistor will be mainly explained and the explanation of gate pad and data pad will be omitted.

As shown in FIG. 5, a gate electrode 224 of conducting material is formed on a transparent substrate 210. The gate electrode 224 includes a lower layer 224a and an upper layer 224b which is thinner than the lower layer 224a and covers upper and side faces of the lower layer 224a. The lower layer 224a is made of copper and the upper layer 224b is made of nickel. The upper layer 224b is formed by a plating method.

On the gate electrode 224, a gate insulation layer 230 made of silicon oxide is formed to cover the gate electrode 224.

An oxidation semiconductor layer 242 is formed on the gate insulation layer 230 over the gate electrode 224 and an etch stopper 246 is formed on the oxidation semiconductor layer 242 corresponding to the center of the semiconductor layer 242. The etch stopper 246 prevents the exposure of the oxidation semiconductor layer 242 to an etching solution during manufacturing of the array substrate. The semiconductor layer 242 may be formed of indium-gallium-zinc-oxide (IGZO) and the etch stopper 246 may be formed of silicon oxidation layer.

Source and drain electrodes 254 and 256 are formed on the etch stopper 246 and the oxidation semiconductor layer 242. The source electrode 254 and the drain electrode 256 are separated from each other having the gate electrode 224 in between. The source and drain electrodes 254 and 256 include lower layers 254a and 256a and upper layers 254b and 256b, respectively. The upper layer 254b and 256b are thinner than the lower layers 254a and 256a and cover upper and side surfaces thereof, respectively. The lower layers 254a and 256a may be formed of copper and the upper layers 254b and 256b may be formed of nickel. The upper layers 254b and 256b are formed by a plating method.

A passivation layer 260 is formed on the source and drain electrodes 254 and 256 and includes a drain contact hole 260a to expose the drain electrode 256. The passivation layer 260 may be a silicon oxidation layer.

A pixel electrode 272 made of transparent conducting material is formed on the passivation layer 260 and connected to the drain electrode 256 through the drain contact hole 260a.

The manufacturing method of the array substrate according to the second embodiment of the invention is explained. FIGS. 6A to 6G are cross-sectional views showing a manufacturing process of the array substrate according to the second embodiment of the present invention.

Figure 6A:
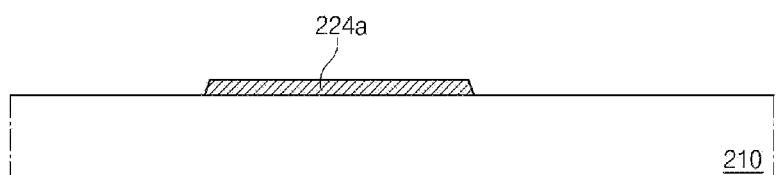
FIGS. 6A to 6G are cross-sectional views showing a manufacturing process of the array substrate according to the second embodiment of the present invention.

As shown in FIG. 6A, conducting material such as a metallic material is deposited onto a transparent insulation substrate 210 such as a glass or a plastic by a depositing method, such as sputtering. Using a photo-lithography method the lower layer 224a of the gate electrode 224 is formed.

The lower layer 224a of the gate electrode 224 is made of a first material such as copper which has relatively low specific resistance to lower resistance of lines and to prevent delay of signals. The lower layer 224a of the gate electrode 224 may be a single layer of copper. Alternatively, in order to increase interface characteristics they may have a double layered structure that a buffer layer made of molybdenum, titanium, tantalum, or alloys of these is positioned beneath the copper layer.

Figure 6B:
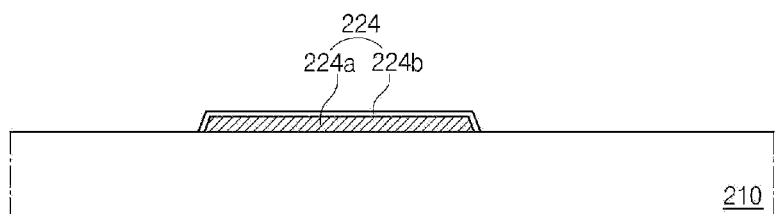

Next, as shown in FIG. 6B, by a plating process the upper layer 224b of the gate electrode 224 is formed to cover upper and side surfaces of the lower layer 224a of the gate electrode 224, thereby forming the gate electrode. The upper layers 224b can be made of a second material such as nickel and an electroless-plating method can be adopted for the plating process.

Here, the upper layer 224b of the gate electrode 224 is preferably thinner than the lower layer 224a of the gate electrode 224. If the upper layer 224b is too thick, the height of the gate electrode 224 becomes big, which may cause shortage of the layers formed in the later on the upper layer 224b and may adversely affect the uniformity of cell gap of the device. Therefore, the thickness of the lower layer 224a is in a range from 2000 Å to 3 μm, and the thickness of the upper layer 224b is in a range from 300 Å to 900 Å.

Figure 6C:
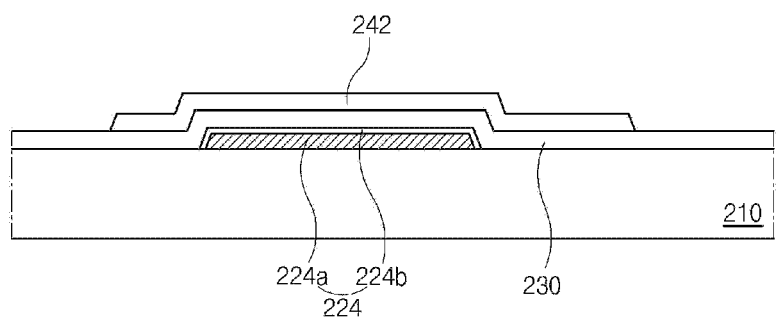

As shown in FIG. 6C, the gate insulation layer 230 and the oxidation semiconductor material layer (not shown) are sequentially formed on the gate electrode 224 and the oxidation semiconductor layer 242 is formed by pattering the oxidation semiconductor material layer by a photo-lithography method. Here, the gate insulation layer may be a single layer made of silicon oxide ($SiO_2$) or has a double layered structure of a lower layer of silicon nitride ($SiN_x$) and an upper layer of silicon oxide ($SiO_2$). The semiconductor layer can be made of indium-gallium-zinc-oxide (IGZO).

Figure 6D:
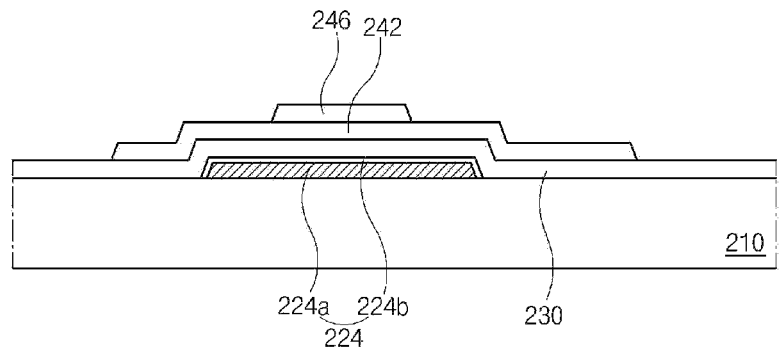

Next, as shown in FIG. 6D, the etch stopper 246 is formed by depositing a silicon oxidation layer using a photo-lithography method. The etch stopper 246 is positioned corresponding to the center of the oxidation semiconductor layer 242. As mentioned previously, the etch stopper 246 prevents the exposure of the oxidation semiconductor layer 242 to an etching solution during manufacturing of the array substrate.

Figure 6E:
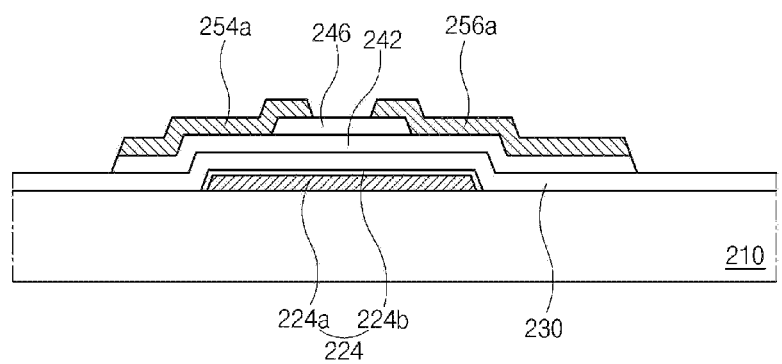

As shown in FIG. 6E, conducting material such as a metallic material is deposited by a depositing method, such as sputtering, and by using a photo-lithography method, the lower layers 254a and 256a of the source electrode 254 and the drain electrode 256 are formed.

The lower layers 254a and 256a of the source electrode 254 and the drain electrode 256 are made of a first material such as copper which has relatively low specific resistance to lower resistance of lines and to prevent delay of signals. The lower layers 254a and 256a of the source electrode 254 and the drain electrode 256 may be a single layer of copper or may have a double layered structure that a buffer layer made of molybdenum, titanium, tantalum, or alloys of these is positioned beneath the copper layer to increase interface characteristics.

Figure 6F:
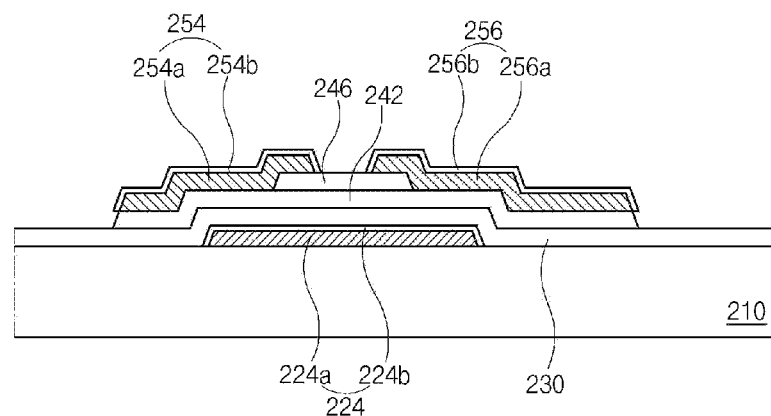

Next, as shown in FIG. 6F, by a plating process the upper layers 254b and 256b of the source electrode 254 and the drain electrode 256 are formed to cover upper and side surfaces of the lower layers 254a and 256a of the source electrode 254 and the drain electrode 256, thereby forming the source electrode 254 and the drain electrode 256. The upper layers 254b and 256b can be made of a second material such as nickel and an electroless-plating method can be adopted for the plating process.

Here, the upper layers 254b and 256b are preferably thinner than the lower layers 254a and 256a of the source electrode 254 and the drain electrode 256. If the upper layers 254b and 256b are too thick, the heights of the source electrode 254 and the drain electrode 256 become big, which may cause shortage of the layers formed in the later on the upper layers 254b and 256b and may adversely affect the uniformity of cell gap of the device. Therefore, the thickness of the lower layers 152a, 154a, 156a and 158a is in a range of 2000 Å to 3 μm, and the thickness of the upper layers 152b, 154b, 156b and 158b is in a range of 300 Å to 900 Å.

Next, in order to eliminate hydrogen gases occurring during the formation of the source and drain electrodes 254 and 256, a heat treatment is performed on the substrate 210 including the source and drain electrodes 254 and 256. At this time, since the lower layers 254a and 256a of the source and drain electrodes 254 and 256 are covered by the upper layers 254b and 256b of nickel, the lower layers 254a and 256a are not oxidized even by the heat treatment process since nickel is more resistive to the heat treatment process compared to copper. That is to say, the lower layer would not be taken off.

Figure 6G:
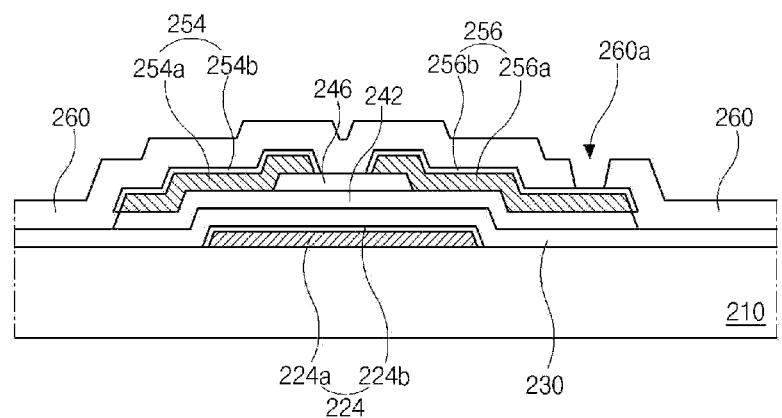

Next, as shown in FIG. 6G, the passivation layer 260 is formed by depositing an inorganic layer such as a silicon oxide layer. The passivation layer 260 is patterned by a photolithography method using a mask to form the drain contact hole 260a to expose the drain electrode 256.

Next, as shown in FIG. 5, transparent conductive material is deposited and patterned by a photolithography method suing a mask to form the pixel electrode 272, which is connected to the upper layer 256b of the drain electrode 256 through the drain contact hole 260a. The transparent conductive material can be indium zinc oxide (IZO) and indium tin oxide (ITO).

As explained above, according to the second embodiment of the invention, since the source and drain electrodes 254 and 256 include the lower layers 254a and 256a and the upper layers 254b and 256b, made of a first material such as copper and a second material such as nickel, respectively, during the heat treatment process done after the formation of the source and drain electrodes 254 and 256, oxidation of the copper layer is prevented. That is to say, the source and drain electrodes 254 and 256 are not taken off and degradation of the thin film transistor is prevented.

Meanwhile, the upper layer 224b of the gate electrode 224 is not essential in this embodiment.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate for a display device, comprising:
   a substrate;
   a gate pad, a gate electrode, and a gate line formed on the substrate;
   a gate insulation layer formed over the gate pad, the gate electrode, and the gate line;
   a semiconductor layer formed on the gate insulation layer;
   a drain electrode and a source electrode formed on the semiconductor layer, a thin film transistor including the gate electrode, the drain electrode, and the source electrode;
   a data line formed on the gate insulation layer and crossing the gate line to define a pixel area, the data line coupled to the source electrode;
   a passivation layer formed over the data line, the source electrode, the drain electrode, and a portion of the gate insulation layer, the passivation layer including a drain contact hole to expose the drain electrode; and
   a pixel electrode formed on the passivation layer in the pixel area and connected to the drain electrode through the drain contact hole, and
   wherein each of the data line, the source electrode, and the drain electrode includes a lower layer having copper and an upper layer covering upper and side surfaces of the lower layer, and wherein the upper layer is thinner than the lower layer.

2. The array substrate of claim 1, wherein the gate pad is positioned at one end of the gate line and the data pad is positioned at one end of the data line, and wherein the passivation layer further includes a data pad contact hole to expose the data pad and a gate pad contact hole to expose the gate pad through the gate insulation layer and the passivation layer.

3. The array substrate of claim 1, wherein a thickness of the upper layer is in a range from 300 Å to 900 Å.

4. The array substrate of claim 1, wherein the semiconductor layer is an oxidation semiconductor layer and the thin film transistor includes an etch stopper formed on the oxidation semiconductor layer between the gate electrode, the source electrode, and the drain electrode.

5. The array substrate of claim 1, wherein each of the gate line and the gate electrode includes a lower layer made of copper and an upper layer that covers upper and side surfaces of the lower layer and is thinner than the lower layer.

6. The array substrate of claim 5, wherein the upper layer of each of the data line, the source electrode, and the drain electrode includes nickel and the upper layer of each of the gate line and the gate electrode includes nickel.

7. A method of fabricating an array substrate for a display device, the method comprising the steps of:
   forming a gate pad, a gate electrode, and a gate line on a substrate;
   forming a gate insulation layer over the gate pad, the gate electrode, and the gate line;
   forming a semiconductor layer on the gate insulation layer;
   forming a drain electrode and a source electrode on the semiconductor layer, a thin film transistor including the gate electrode, the drain electrode, and the source electrode;
   forming a data line on the gate insulation layer, the data line crossing the gate line to define a pixel area and the data line coupled to the source electrode;
   forming a passivation layer over the data line, the source electrode, the drain electrode, and a portion of the gate insulation layer, the passivation layer including a drain contact hole to expose the drain electrode; and
   forming a pixel electrode on the passivation layer in the pixel area, the pixel electrode connected to the drain electrode through the drain contact hole, and
   wherein each of the data line, the source electrode, and the drain electrode is formed to include a lower layer having copper and an upper layer covering upper and side surfaces of the lower layer, and wherein the upper layer is formed thinner than the lower layer.

8. The method of claim 7, wherein the gate pad is formed at one end of the gate line and a data pad is formed at one end of the data line, and wherein forming the passivation layer includes forming a data pad contact hole to expose the data pad and forming a gate pad contact hole to expose the gate pad.

9. The method of claim 7, wherein a thickness of the upper layer is in a range from 300 Å to 900 Å.

10. The method of claim 7, further comprising forming an etch stopper on a portion of the semiconductor layer and wherein the semiconductor layer includes oxidation semiconductor material.

11. The method of claim 7, wherein forming the gate line and the gate electrode includes forming a lower layer made of copper and forming an upper layer using a plating method, the upper layer covering upper and side surfaces of the lower layer and being thinner than the lower layer.

12. The method of claim 11, wherein the upper layer of each of the data line, the source electrode, and the drain electrode includes nickel and the upper layer of each of the gate line and the gate electrode includes nickel.

13. An array substrate for a display device, comprising:
a substrate;
a gate pad, a gate electrode, and a gate line formed on the substrate;
a gate insulation layer formed over the gate pad, the gate electrode, and the gate line;
a semiconductor layer formed on the gate insulation layer;
a drain electrode and a source electrode formed on the semiconductor layer, a thin film transistor including the gate electrode, the drain electrode, and the source electrode, the source electrode including a first source electrode layer made of a first material and a second source electrode layer made of a second material that covers the first source electrode layer, and the drain electrode including a first drain electrode layer made of the first material and a second drain electrode layer made of the second material that covers the first drain electrode layer;
a data line formed on the gate insulation layer and crossing the gate line to define a pixel area, the data line coupled to the source electrode and including a first data line layer made of the first material and a second data line layer made of the second material that covers the first data line layer;
a passivation layer formed over the data line, the source electrode, the drain electrode, and a portion of the gate insulation layer, the passivation layer including a drain contact hole to expose the drain electrode; and
a pixel electrode formed on the passivation layer in the pixel area and connected to the drain electrode through the drain contact hole, and
wherein the second data line layer is thinner than the first data line layer, the second source electrode layer is thinner than the first source electrode layer, and the second drain electrode layer is thinner than the first drain electrode layer.

14. The array substrate of claim 13, wherein the first material includes copper and the second material includes nickel.

15. The array substrate of claim 13, wherein the gate pad is positioned at one end of the gate line and the data pad is positioned at one end of the data line; and
wherein the passivation layer further includes a data pad contact hole to expose the data pad and a gate pad contact hole to expose the gate pad through the gate insulation layer and the passivation layer.

16. The array substrate of claim 13, wherein a thickness of the second data line layer, a thickness of the second source electrode layer, and a thickness of the second drain electrode layer is each in a range of 300 Å to 900 Å and wherein a thickness of the first data line layer, a thickness of the first source electrode layer, and a thickness of the first drain electrode layer is each in a range of 2000 Å to 3μm.

17. The array substrate of claim 13, wherein the semiconductor layer is an oxidation semiconductor layer and the thin film transistor includes an etch stopper formed on the oxidation semiconductor layer between the gate electrode, the source electrode, and the drain electrode.

18. The array substrate of claim 13, wherein the gate line includes a first gate line layer made of the first material and a second gate line layer made of the second material that covers the first gate line layer, and wherein the gate electrode includes a first gate electrode layer made of the first material and a second gate electrode layer made of the second material that covers the first gate electrode layer.

19. A method of fabricating an array substrate for a display device, the method comprising:
forming a gate pad, a gate electrode, and a gate line formed on a substrate;
forming a gate insulation layer over the gate pad, the gate electrode, and the gate line;
forming a semiconductor layer on the gate insulation layer;
forming a drain electrode and a source electrode on the semiconductor layer, a thin film transistor including the gate electrode, the drain electrode, and the source electrode, the source electrode formed to include a first source electrode layer made of a first material and a second source electrode layer made of a second material that covers the first source electrode layer, and the drain electrode formed to include a first drain electrode layer made of the first material and a second drain electrode layer made of the second material that covers the first drain electrode layer;
forming a data line on the gate insulation layer, the data line crossing the gate line to define a pixel area, the data line coupled to the source electrode and formed to include a first data line layer made of the first material and a second data line layer made of the second material that covers the first data line layer;
forming a passivation layer over the data line, the source electrode, the drain electrode, and a portion of the gate insulation layer, the passivation layer formed to include a drain contact hole to expose the drain electrode; and
forming a pixel electrode on the passivation layer in the pixel area, the pixel electrode being connected to the drain electrode through the drain contact hole, and
wherein the second data line layer is thinner than the first data line layer, the second source electrode layer is thinner than the first source electrode layer, and the second drain electrode layer is thinner than the first drain electrode layer.

20. The method of claim 19, wherein the first material includes copper and the second material includes nickel.

* * * * *